(12) United States Patent
Xiang

(10) Patent No.: US 8,087,453 B2
(45) Date of Patent: Jan. 3, 2012

(54) PROGRAMMABLE CONTROLLED HEAT DISSIPATING FAN

(75) Inventor: Liu-Chun Xiang, Guangdong (CN)

(73) Assignee: Everflow Precision Electronic (Dong Guan) Co., Ltd., Guangdong (CN)

( * ) Notice: Subject to any disclaimer, the term of this patent is extended or adjusted under 35 U.S.C. 154(b) by 1038 days.

(21) Appl. No.: 11/964,610

(22) Filed: Dec. 26, 2007

(65) Prior Publication Data
US 2009/0168347 A1 Jul. 2, 2009

(51) Int. Cl.
*F28F 7/00* (2006.01)
(52) U.S. Cl. .................. 165/104.33; 165/80.3
(58) Field of Classification Search .............. 165/80.3; 340/3.22, 13.31, 12.28; 361/679.48
See application file for complete search history.

(56) References Cited

U.S. PATENT DOCUMENTS

| | | | |
|---|---|---|---|
| 7,163,050 B2 * | 1/2007 | Wang et al. | 165/104.33 |
| 7,545,833 B2 * | 6/2009 | Chau et al. | 370/516 |

* cited by examiner

*Primary Examiner* — Vernal Brown

(57) ABSTRACT

A programmable controlled heat dissipating fan is comprised of a base, a stator assembly, a magnet frame assembly, a fan blade assembly, an inductor set, a first circuit board and a second circuit board. The stator assembly is firmly installed in the base, while the magnet assembly is sleeved into the periphery of the stator assembly. The fan blade assembly is rotated through the alternatively changing magnetic field produced by the stator winding and magnet frame, while the second circuit board is rotated and powered by electromagnetic coupling. The data content stored in the data repository is loaded by the microprocessor to drive the light emitting unit to display.

6 Claims, 6 Drawing Sheets

PROGRAMMABLE CONTROLLED HEAT DISSIPATING FAN

BACKGROUND OF THE INVENTION (a) Field of the Invention

The new type invention is related to technologies of heat dissipating fans, especially related to a programmable controlled heat dissipating fan.

(b) Description of the Prior Art

As is well known, heat dissipating fan is a must-have component in the equipments such as computers, etc, whereof it is generally comprised of fan blades and fan body while through the alternative change of magnetic field generated between the stator winding and the magnet frame, the fan blades are driven to rotate by the fan driving circuit whereby to achieve the heat dissipation effect due to acceleration of air flow during the fan rotation process. At present, outlooks and functions of the conventional dissipating fans are more unitary, lacking beauty and moving effects that do not better serve the consumer demands, and so is harder to seduce the buying desires of consumers. Following the rapid advancements of science and technology, the industry has offered a kind of time and date displayable fan whose related patent documentations can be referred to Chinese patent announcement No. CN2859025Y. which discloses a fan comprised of a fan head and its connected power supply device, whereof an light emitter array module is installed through the fan blade, and a driving circuit board is installed inside the fan head and connected with the said light emitter array module, whereof the said driving circuit board is installed with a power supply battery and is loaded with a driver program to drive the light emitter array module to display time, date, image and text, thereby to provide the time, date, image and text displaying functions. However, the said fan has the following imperfections: On one hand, the said driving circuit needs an external interface to get external power supply that is troublesome to customers and is inconvenient for use, and obviously, it is not adaptive to the resent trends of development. On the other hand, as the driver program on the said driving circuit is fixed, i.e. the internally preloaded display program is unchangeable, whereof customer cannot switch it freely as needed, the application is unitary and not good for market competition.

SUMMARY OF THE INVENTION

Regarding the imperfections of the aforesaid present arts, the main purpose of the practical new type invention is to provide a programmable controlled heat dissipating fan which employs the induction-coupling design to achieve the high frequency emission and electromagnetic coupling purposes, whereby to provide working power to the second circuit board through non-contact electrical power transmission, whereof the program in the data depository is loaded by the microprocessor on the second circuit board to drive the light emitters array to display, thereby to effectively achieve a decoration effect.

The second purpose of the practical new type invention is to provide a programmable controlled heat dissipating fan, whereof the data content can be pre-loaded through the program loader interface circuit and the data memory installed on the second circuit board to achieve the purpose of unlimited program replacement, thereby to obtain the convenience of use.

The third purpose of the practical new type invention is to provide a programmable controlled heat dissipating fan, whereof through connection to the audio broadcast unit on the second circuit board, the double effect of visual and audio combinations can be achieved.

The fourth purpose of the practical new type invention is to provide a programmable controlled heat dissipating fan, whereof it is further adopted a program loader which is convenient to use and is in simple structure for loading the related programs to the second circuit board.

To achieve the aforesaid purposes, the practical new type invention has adopted the following methods:

A programmable controlled heat dissipating fan, in which it is comprised of a base, a stator assembly, a magnet frame and a fan blade assembly, whereof the said stator assembly is firmly installed in the base 10 while the said magnet assembly is sleeved into the periphery of the said stator assembly, and further include that:

An inductor set which is assembled by putting a emitter inductor and a receiver conductor close to each other but without contacting, whereof the said emitter inductor is firmly installed at the stator assembly; and A first circuit board which is firmly installed at the base, whereof the said first circuit board is sequentially installed electrically inter-connected with a pulse signal circuit and a power amplifier circuit, whereof the said pulse signal circuit can generate pulse signal to the power amplifier circuit for amplification, thus the magnet winding is actuated and through the emitter inductor to emit high frequency electrical energy; and A second circuit board which is firmly installed on top of the fan blade assembly, whereof its working power is generated after treating the high frequency electrical energy which is radiated by the emitter inductor and inducted by the receiver inductor, whereof the said second circuit board is installed with a light emitter array unit, a microprocessor to drive the said light emitter array unit for display function and a data repository for data saving, whereof program in the said data repository is treated by the microprocessor to drive the light emitter array unit, whereby to display the program saved in the data repository.

The aforesaid light emitter array is a LED array.

The said microprocessor is installed with a program loader interface circuit, whereby the external connected program loader is through the said program loader interface circuit to save the pre-edited data in the data repository through the microprocessor.

The said externally connected program loader is comprised of a USB interface, a main body and a program loader interface, whereof the said main body is comprised of a plastic casing and the third circuit board which is enclosed in the plastic casing, whereof the said third circuit board is installed with a microcontroller, whereof the said microcontroller is through data bus to connect with the USB interface and program loader interface.

The aforesaid third circuit board is installed with a working status indicator circuit which is connected with the microcontroller.

The said microprocessor is electrically connected with an audio broadcast unit, whereby the said microprocessor drive the said audio broadcast unit to work.

Comparing with the conventional arts, the advantage of the practical new type invention are the following:

The practical new type invention mainly employs the induction-coupling design to achieve the high frequency emission and electromagnetic coupling purposes, whereby to provide working power to the second circuit board through non-contact electrical power transmission and through the second circuit board to effectively achieve a decoration effect.

The data content can be pre-loaded through the program loader interface circuit and the data memory installed on the second circuit board to achieve the purpose of loading, modifying and replacing the data content in the data memory at any time, thereby to obtain the convenience of use.

Through connection to the audio broadcast unit on the second circuit board, the double effect of visual and audio combinations can be achieved.

The attached program loader has a simple structure and is convenient for operation.

DETAILED DESCRIPTION OF THE PREFERRED EMBODIMENTS

Figure 1:
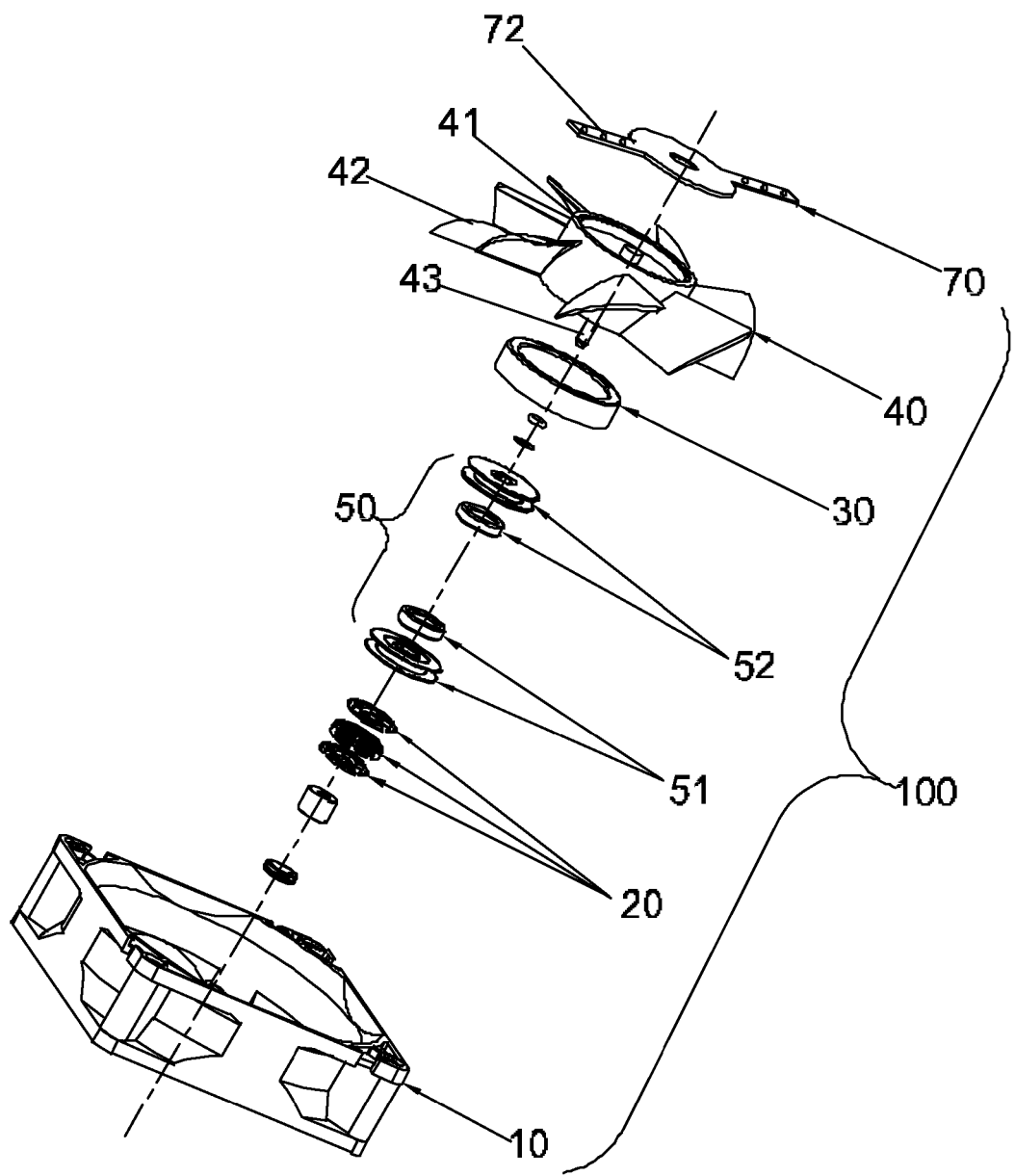
FIG. 1 is a 3D explosion structure schematic view of the practical new type invention.

The practical new type invention is further delineated by combining the following attached drawings and embodiments.

A programmable controlled heat dissipating fan 100 as shown in FIGS. 1~7, whereof it is comprised of a base 10, a stator assembly 20, a magnet frame 30 and a fan blade assembly 40, whereof the said stator assembly 20 is firmly installed in the base 10 while the said magnet assembly 30 is sleeved into the periphery of the said stator assembly 20, and the fan component 40 is composed of the fan frame 41 and several fan blades 42 at its periphery. The said fan frame 41 is firmly installed with a rotating shaft 43, whereof the said rotating shaft 43 is inserted into the copper shaft to become a rotating structure, whereof the inter-cooperating structure of the said base 10, stator assembly 20, magnet frame assembly 30 and the fan blade assembly 40 can be adopted with the present matured arts, therefore detail of which are not described herein.

Figure 2:
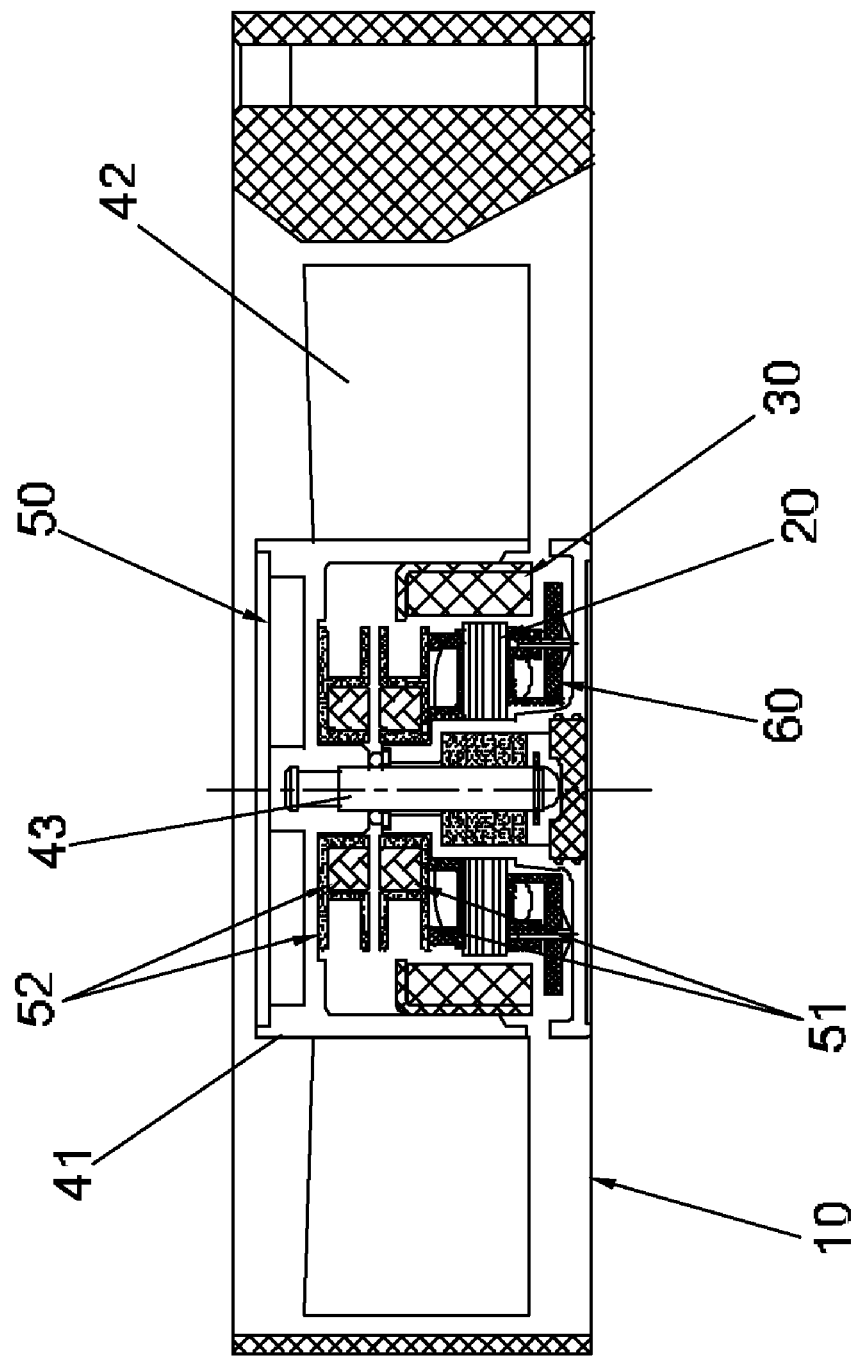
FIG. 2 is an assembly sectional structure schematic view of the practical new type invention.

The heat dissipating fan 100 of the practical new type invention is further comprised of an inductor set 50, a first circuit board 60 and a second circuit board 70, in which:

As shown in FIGS. 1 and 2, the inductor set 50 is assembled by putting a emitter inductor 51 and a receiver conductor 52 close to each other but without contacting, whereof the said emitter inductor 51 is firmly installed at the stator assembly 20 while the said receiver inductor 52 is firmly installed at the fan blade assembly 40.

Figure 3:
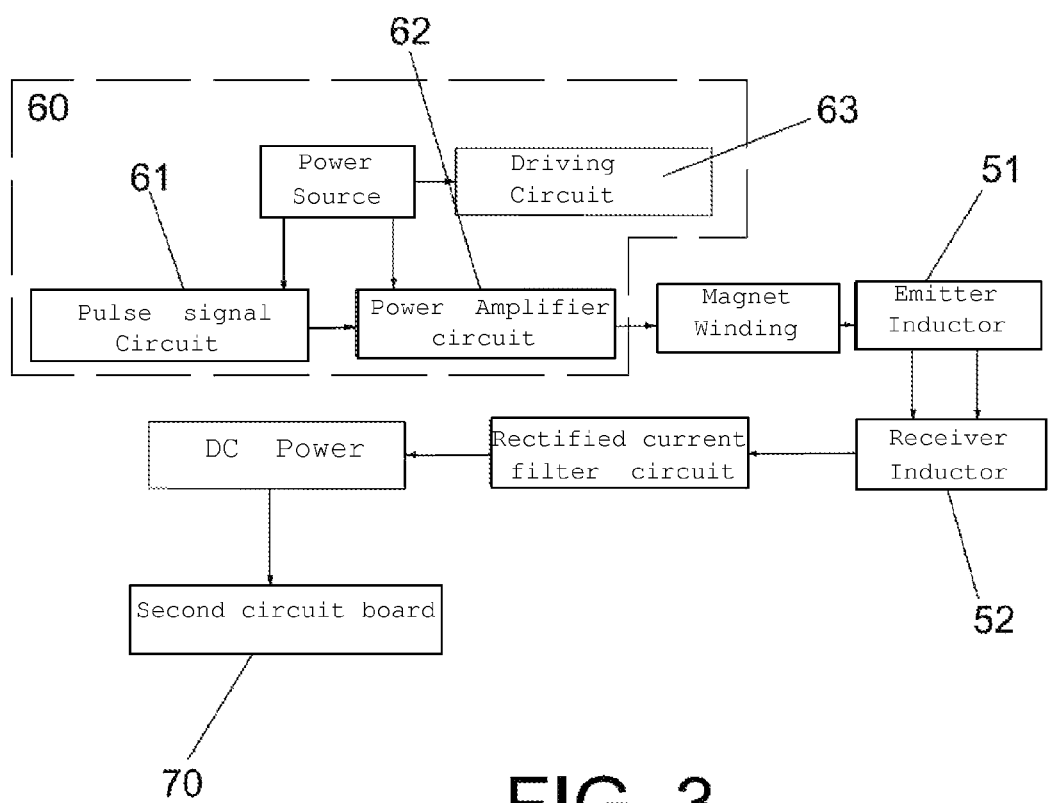
FIG. 3 is the circuit principle schematic drawing of the first circuit board of the practical new type invention.

The first circuit board 60 is firmly installed at the base 10 as shown in FIG. 3, whereof the said first circuit board 60 is sequentially installed electrically inter-connected with a pulse signal circuit 61 and a power amplifier circuit 62, whereof the said pulse signal circuit 61 can generate pulse signal to the power amplifier circuit 62 for amplification, thus the magnet winding is actuated and through the emitter inductor 51 to radiate high frequency electrical energy. Of course, the said first circuit board 60 is further installed with a driving circuit 63 to drive the fan blade assembly 40, whereas the said driving circuit is a current art, it is not described herein.

Figure 4:
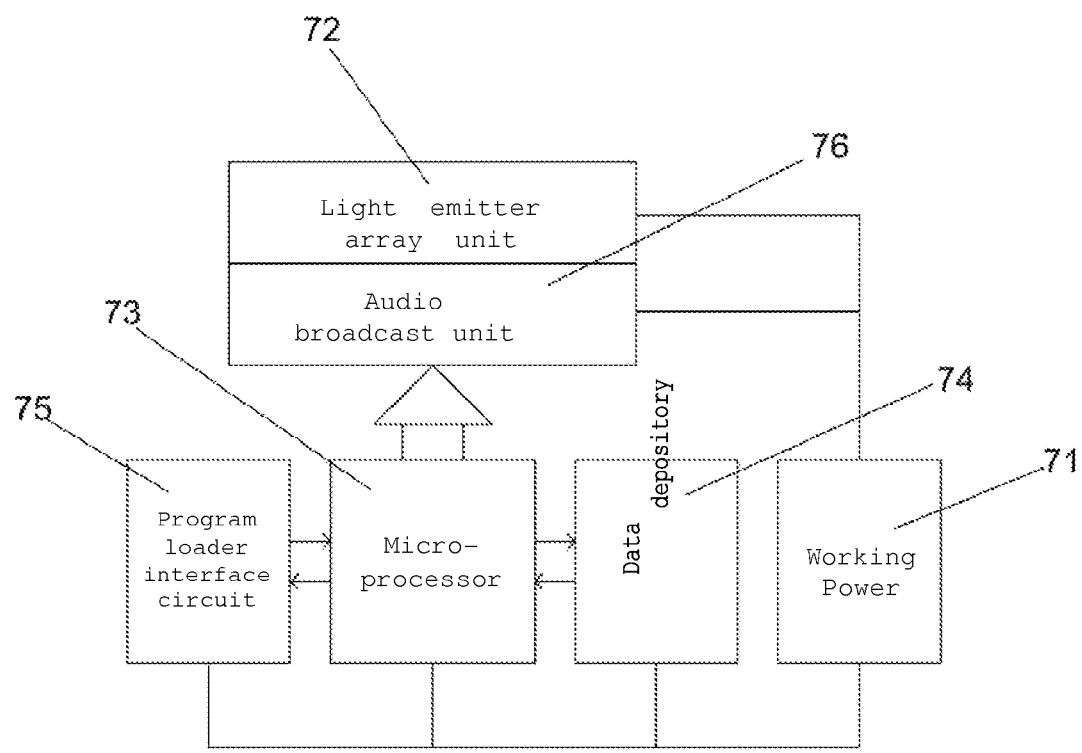
FIG. 4 is the circuit principle schematic drawing of the second circuit board of the practical new type invention.

The second circuit board 70 which is firmly installed at the top surface of the fan blade assembly 40, whereby the said second circuit board 70 is rotated along with the fan blade assembly 40; whereof as shown in FIG. 4, the working power 71 of the said second circuit board 70 is generated after treating the high frequency electrical energy which is radiated by the emitter inductor 51 and inducted by the receiver inductor 52, whereof the said second circuit board 70 is installed with a light emitter array unit 72, a microprocessor 73 to drive the said light emitter array unit 72 for display function and a data repository 74 for data saving, whereof program in the said data repository 74 is treated by the microprocessor 73 to drive the light emitter array unit 72, whereby to display the program saved in the data repository 74 through the microprocessor 73. The said light emitter array unit 72 is a LED array.

The said microprocessor 73 is installed with a program loader interface circuit 75, whereby the external connected program loader 80 is through the said program loader interface circuit 75 to save the pre-edited data in the data repository 74 through the microprocessor 73. Therefore, needed data can be pre-recorded through the program loader interface circuit 75 and the data memory 74, thereby to realize the purpose of unlimited data content replacement by loading or modifying data at any time. In addition, in case of power outage, the data content can be still saved in the data memory 74 so as to achieve convenience of use.

Further, as shown in FIG. 4, the said microprocessor 73 can be connected to an audio broadcast unit 76 which is driven by the said microprocessor 73 to work, thereby to achieve the double effect of visual and audio combinations.

Figure 5:
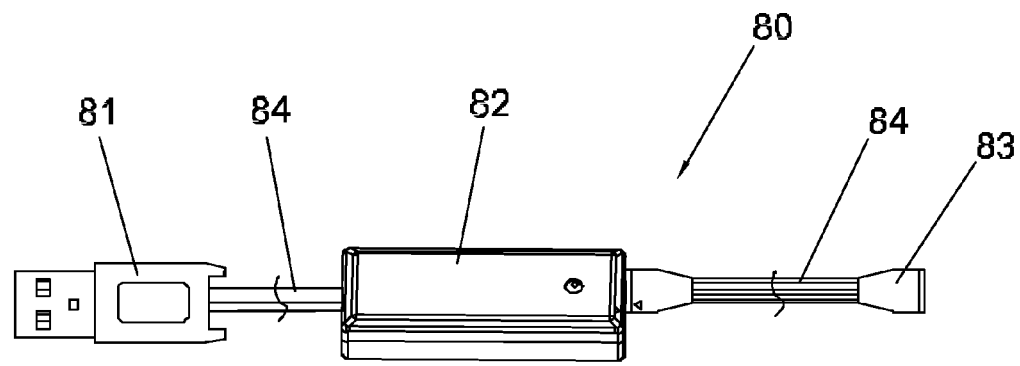
FIG. 5 is a overall outlook schematic drawing of the program loader of the practical new type invention.
Figure 6:
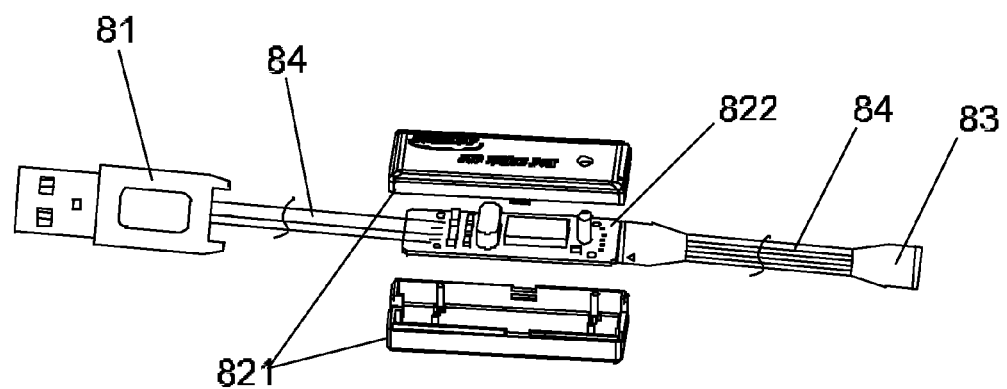
FIG. 6 is a 3D explosion schematic view of FIG. 5.
Figure 7:
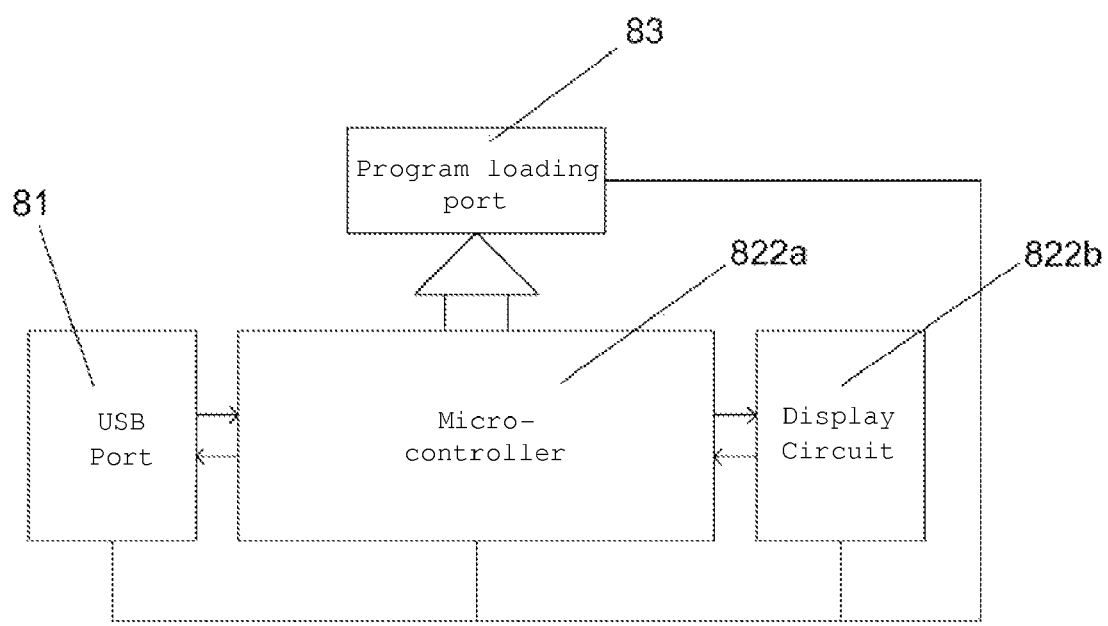
FIG. 7 is the circuit principle schematic drawing of FIG. 6.

The said externally connected program loader 80 as shown in FIGS. 5~7 is comprised of a USB interface 81, main body 82 and a program loader interface 83, whereof the said main body 82 is comprised of a plastic casing 821 and the third circuit board 822 which is enclosed in the plastic casing 821. The said third circuit board 822 is installed with a microcontroller 822a, whereof the said microcontroller 822a is through the data bus 84 to connect with the USB interface 81 and the program loader interface 83. During data loading process, the said program loader interface 83 is connected with the program loader interface circuit 75 on the second circuit board 70. Further, the said third circuit board 822 is installed with a working status indicator circuit 822b which is electrically connected with the microcontroller 822a to indicate the working status of the program loader 80. For example, in PC operating interface, data contents such as text, symbols, data, music, voices and pictures are input through PC keyboard, editor software and depositories, whereof through the said USB interface 81 to connected with PC, the pre-edited data on PC is transferred through the microcontroller 822a on the third circuit board 822 and the program loader interface 83 to the second circuit board 70 for treatment and is recorded into the data repository 74 on the second circuit board 70.

The working principle of the practical new type invention is that after connection to power, rotation of the fan blade assembly 40 of the heat dissipating fan 100 is through the alternatively changing magnetic field produced between the winding on stator assembly 20 and the magnet frame 30 to be driven by the driving circuit on the first circuit board 60, while when the said fan blade assembly 40 is at rotating status, the said second circuit board 70 is also rotated along with the rotation of fan blade assembly 40 accordingly. Further, the working power is provided by the said second circuit board 70 after achieved electromagnetic coupling among the emitter inductor 51, receiver inductor 52 and magnet frame 30, in which the pulse signal generated by the pulse signal circuit 61 on the first circuit board 60 is amplified through the power amplifier circuit 62 to drive the magnet inductor to work, whereby the high frequency electrical energy radiated by the emitter inductor is received and inducted by the receiver inductor 52, whereby the said high frequency electrical energy is further through the rectified current filter circuit to obtain DC power. Further, after the second circuit board 70 is powered, data content stored in the data repository 74 is loaded by the microprocessor 73 on the said second circuit board 70, whereof the data content including displays of time, date, image and test, symbols and identifications, etc is treated by the microprocessor 73 which then drives the light emitting unit 72 to display, thereby to achieve a decoration effect of dynamic flashing and display along with the rotating process of fan blade assembly 40, while the pre-edited data content saved in the aforesaid data repository 74 can be loaded by the microprocessor 73 through the externally connected program loader 80 and the program loader interface circuit 75 to achieve the purpose of loading, modifying and replacing the data content in the data memory 74 at any time as well as to save the said data content in the data memory 74 after power off.

The practical new type invention mainly employs the induction-coupling design to achieve the high frequency emission and electromagnetic coupling purposes, whereby to provide working power to the second circuit board through non-contact electrical power transmission and through the second circuit board to effectively achieve a decoration effect, while at the same time, data content can be pre-loaded through the program loader interface circuit and the data memory installed on the second circuit board to achieve the purpose of loading, modifying and replacing the data content in the data memory at any time, thereby to obtain the convenience of use.

The above description is just for one preferred embodiment of the programmable controlled heat dissipating fan of the practical new type invention that is not meant to limit the technical range covered by the practical new type invention, therefore any tiny modification, equivalent variations or refinement on the aforesaid embodiments of the practical new type invention in essence shall still belong to the range of the practical new type invention.

The invention claimed is:

1. A programmable controlled heat dissipating fan, in which it is comprised of a base, a stator assembly, a magnet frame and a fan blade assembly, whereof the said stator assembly is firmly installed in the base 10 while the said magnet assembly is sleeved into the periphery of the said stator assembly, whereof it is characterized to further include that:

An inductor set which is assembled by putting a emitter inductor and a receiver conductor close to each other but without contacting, whereof the said emitter inductor is firmly installed at the stator assembly; a first circuit board which is firmly installed at the base; and A first circuit board is sequentially installed electrically inter-connected with a pulse signal circuit and a power amplifier circuit, whereof the said pulse signal circuit can generate pulse signal to the power amplifier circuit for amplification, thus the magnet winding is actuated and through the emitter inductor to emit high frequency electrical energy; and The second circuit board which is firmly installed on top of the fan blade assembly, whereof its working power is generated after treating the high frequency electrical energy which is radiated by the emitter inductor and inducted by the receiver inductor, whereof the said second circuit board is installed with a light emitter array unit, a microprocessor to drive the said light emitter array unit for display function and a data repository for data saving, whereof program in the said data repository is treated by the microprocessor to drive the light emitter array unit, whereby to display the program saved in the data repository.

2. The programmable controlled heat dissipating fan as in claim 1 which is characterized in that the aforesaid light emitter array is a LED array.

3. The programmable controlled heat dissipating fan as in claim 2, which is characterized in that the said microprocessor is installed with a program loader interface circuit, whereby the external connected program loader is through the said program loader interface circuit to save the pre-edited data in the data repository through the microprocessor.

4. The programmable controlled heat dissipating fan as in claim 3, which is characterized in that the said externally connected program loader is comprised of a USB interface, a main body and a program loader interface, whereof the said main body is comprised of a plastic casing and the third circuit board which is enclosed in the plastic casing, whereof the said third circuit board is installed with a microcontroller, whereof the said microcontroller is through data bus to connect with the USB interface and program loader interface.

5. The programmable controlled heat dissipating fan as in claim 4 which is characterized in that the aforesaid third circuit board is installed with a working status indicator circuit which is connected with the microcontroller.

6. The programmable controlled heat dissipating fan as in claim 1 which is characterized in that the said microprocessor is electrically connected with an audio broadcast unit, whereby the said microprocessor drive the said audio broadcast unit to work.

* * * * *